(12) United States Patent
Kawasaki et al.

(10) Patent No.: US 7,952,177 B2
(45) Date of Patent: May 31, 2011

(54) RESIN-SEALED SEMICONDUCTOR DEVICE, LEADFRAME WITH DIE PADS, AND MANUFACTURING METHOD FOR LEADFRAME WITH DIE PADS

(75) Inventors: Tomoki Kawasaki, Kyoto (JP);
Yuichiro Yamada, Ohtsu (JP);
Toshiyuki Fukuda, Nagaokakyou (JP);
Shuichi Ogata, Takatsuki (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/208,804

(22) Filed: Sep. 11, 2008

(65) Prior Publication Data

US 2009/0008754 A1    Jan. 8, 2009

Related U.S. Application Data

(62) Division of application No. 11/194,691, filed on Aug. 2, 2005, now abandoned.

(30) Foreign Application Priority Data

Nov. 10, 2004    (JP) .................................. 2004-326513

(51) Int. Cl.
*H01L 23/02*    (2006.01)
(52) U.S. Cl. .................... 257/678; 257/692; 257/686
(58) Field of Classification Search .................. 257/678, 257/692, 686
See application file for complete search history.

(56) References Cited

U.S. PATENT DOCUMENTS

| | | | |
|---|---|---|---|
| 5,105,259 A * | 4/1992 | McShane et al. | 257/667 |
| 5,378,656 A | 1/1995 | Kajihara et al. | |
| 5,635,756 A | 6/1997 | Kohno et al. | |
| 6,258,630 B1 | 7/2001 | Kawahara | |
| 6,396,142 B1 | 5/2002 | Ito et al. | |
| 6,552,417 B2 | 4/2003 | Combs | |
| 7,211,471 B1 * | 5/2007 | Foster | 438/123 |
| 2002/0074627 A1 * | 6/2002 | Combs | 257/666 |

FOREIGN PATENT DOCUMENTS

| | | |
|---|---|---|
| CN | 1163961 A | 11/1997 |
| CN | 1163961 C | 8/2004 |
| JP | 8-078605 | 3/1996 |
| JP | 11-354706 | 12/1999 |
| JP | 2000-174193 | 6/2000 |
| JP | 2001-15669 A | 1/2001 |

OTHER PUBLICATIONS

Chinese Office Action, issued in Chinese Patent Application No. 200810165935, dated Aug. 28, 2009.
Japanese Office Action issued in Japanese Patent Application No. 2008-187140, mailed Nov. 16, 2010.

* cited by examiner

*Primary Examiner* — Bradley K Smith
*Assistant Examiner* — Mohammad T Karimy
(74) *Attorney, Agent, or Firm* — McDermott Will & Emery LLP

(57) ABSTRACT

A resin-sealed semiconductor device with built-in heat sink prevents internal bulging and cracking caused by exfoliation of a semiconductor element from the heat sink when the vapor pressure of moisture absorbed into a gap between the semiconductor element and the heat sink rises during mounting of the semiconductor device to a printed circuit board using lead-free solder. By providing a plurality of separated die pads (502) in a mounting area for a semiconductor element (301) and adhering the semiconductor element (301) to the heat sink (105) via the die pads (502), space is opened up between the semiconductor element (301) and the heat sink (105) for sealing resin (304) to run into.

20 Claims, 13 Drawing Sheets

RESIN-SEALED SEMICONDUCTOR DEVICE, LEADFRAME WITH DIE PADS, AND MANUFACTURING METHOD FOR LEADFRAME WITH DIE PADS

RELATED APPLICATIONS

This application is a Divisional of U.S. application Ser. No. 11/194,691, filed Aug. 2, 2005, now abandoned claiming priority of Japanese Application No. 2004-326513, filed Nov. 10, 2004, the entire contents of each of which are hereby incorporated by reference.

BACKGROUND OF INVENTION

1. Field of the Invention

The present invention relates to a leadframe for use in a semiconductor device with built-in heat sink, and to a resin-sealed semiconductor device that uses the leadframe.

2. Related Art

In recent years, the miniaturization, high integration and high-density mounting of semiconductor components such as semiconductor devices has been sought in response to the miniaturization of electronic devices. This has resulted in the release of heat generated by semiconductor devices becoming a crucial issue.

Semiconductor devices with built-in heat sinks or exposed die pads have been proposed as a countermeasure to the problem of heat release in semiconductor devices. For example, Japanese Patent Application Publication No. 2001-15669 discloses a semiconductor device with built-in heat sink.

On the other hand, there is growing concern worldwide for the environment, which has lead to increasingly persistent calls for lead-free manufacturing also in relation to semiconductor devices.

However, with a conventional semiconductor device having a built-in heat sink (i.e. two-tiered frame), it is necessary to limit the amount of adhesive used when adhering a semiconductor element to the heat sink, possibly creating a gap between the heat sink and the semiconductor element. Even in the case of the semiconductor device being sealed using sealing resin, the resin does not run into the gap, leaving space for absorbed moisture to gather.

The mounting temperature when mounting a resin-sealed semiconductor device with built-in heat sink to a printed circuit board using lead-free solder is higher than for normal lead solder. This increases the temperature within the semiconductor device, which in turn raises the vapor pressure of absorbed moisture and promotes exfoliation of the semiconductor element from the heat sink, giving rise to the danger of internal bulging and cracking.

SUMMARY OF INVENTION

The present invention aims to provide a resin-sealed semiconductor device in which internal bulging and cracking is prevented even when mounted on a printed circuit board using lead-free solder, and a leadframe for use in the semiconductor device.

To resolve the above problems, the present invention is a resin-sealed semiconductor device having a semiconductor element mounted on a heat sink. The semiconductor device includes: a plurality of outer leads for external electrical connection extending at right angles to sides of a rectangle; a plurality of inner leads in series at one end with the outer leads; the heat sink adhered to an underside of an opposite end of the inner leads; a plurality of substantially square openings provided in the heat sink so as to lie partially outside a mounting area for the semiconductor element and with sides thereof positioned at an angle to a direction in which the outer leads extend; the semiconductor element adhered by adhesive to an upper surface of the heat sink in an area sandwiched by the openings; a plurality of metallic wires electrically connecting the inner leads with corresponding electrode pads of the semiconductor element; and a sealing resin that seals the inner leads, the semiconductor element and the metallic wires, with the outer leads left exposed.

According to the above structure, even if there is a gap between the semiconductor element and the heat sink, sealing resin runs into the gap via the openings. Exfoliation of the semiconductor element is thus prevented even in the case of lead-free solder being used to mount the semiconductor device to a printed circuit board, as is bulging or cracking of the sealing resin.

Note that due to the improved leadframe, semiconductor manufacturing processes using conventional lead-solder may be directly applied as manufacturing processes using lead-free solder.

Here, the sides of the openings may be positioned at an approximately 45° angle, and the semiconductor element may be adhered to the heat sink via a plurality of die pads.

According to this structure, the formation of a gap is prevented because of the semiconductor element being securely adhered via a plurality of die pads.

Here, the resin-sealed semiconductor device may further include a loop-shaped body encircled by the ends of the inner leads and surrounding the mounting area, the loop-shaped body being adhered to the upper surface of the heat sink via an underside thereof and having an inward protrusion positioned centrally on each side thereof.

According to this structure, warping of the heat sink when adhering the heat sink to the underside of the ends of the inner leads during the manufacture of the leadframe is prevented, enabling the shape of the leadframe to be stabilized.

The present invention is also a leadframe for use in a resin-sealed semiconductor device having a semiconductor element mounted on a heat sink. The leadframe includes: a plurality of outer leads for external electrical connection extending at right angles to sides of a rectangle; a plurality of inner leads in series at one end with the outer leads and electrically connected to electrode pads of the semiconductor element via connecting members; the heat sink adhered to an underside of an opposite end of the inner leads; a plurality of substantially square die pads adhered to the heat sink in a mounting area for the semiconductor element so that sides thereof are positioned at an angle to a direction in which the outer leads extend; and a plurality of openings provided in the heat sink so as to form a checkered pattern with the die pads.

According to this structure, the semiconductor element can be securely adhered to the die pads of the leadframe with a small amount of adhesive. Moreover, the formation of a gap between the semiconductor element and the heat sink when manufacturing a resin-sealed semiconductor device that uses the leadframe is prevented because of sufficient sealing resin running between the semiconductor element and the heat sink via the openings. Thus, even in the case of lead-free solder (i.e. requires higher temperature than for normal lead solder) being used to mount the resin-sealed semiconductor device, bulging and cracking of the sealing resin due to the semiconductor element exfoliating can be prevented.

Here, the sides of the die pads may be positioned at an approximately 45° angle, the openings may have rounded vertices, and each opening positioned circumferentially may lie partially outside the mounting area.

According to this structure, sealing resin runs between the semiconductor element and the heat sink via openings positioned partially on the outside of the mounting area for the semiconductor element, enabling the formation of a gap to be securely prevented. Moreover, rounding the vertices of the openings allows the concentration of local stress to be alleviated.

The present invention is also a method of manufacturing a leadframe for use in a resin-sealed semiconductor device having a semiconductor element mounted on a heat sink. The method includes the steps of: etching or stamping a piece of sheet metal to manufacture a metallic member that includes outer leads for external electrical connection extending at right angles to sides of a rectangle, inner leads in series at one end with the outer leads, substantially square die pads positioned with sides thereof at an angle to a direction in which the outer leads extend, a coupling ring coupling together the die pads, a dambar coupling the inner leads to the outer leads in side directions of the rectangle, and hanging leads holding the die pads from vertices of the dambar; adhering an upper surface of the heat sink to an underside of an opposite end of the inner leads and an underside of the die pads; and providing a plurality of openings in the heat sink to form a checkered pattern with the die pads and at the same time sectioning the coupling ring and the hanging leads.

According to this structure, the die pads can be separated at the same time as the openings are formed, which avoids complicating the processes and allows for an improved leadframe.

BRIEF DESCRIPTION OF DRAWINGS

These and other objects, advantages, and features of the invention will become apparent from the following description thereof taken in conjunction with the accompanying drawings, which illustrate specific embodiments of the present invention.

In the drawings.

DETAILED DESCRIPTION OF PREFERRED EMBODIMENTS

Embodiments of a leadframe and a resin-sealed semiconductor device that uses the leadframe pertaining to the present invention are described below with reference to the drawings.

Embodiment 1

Figure 1:
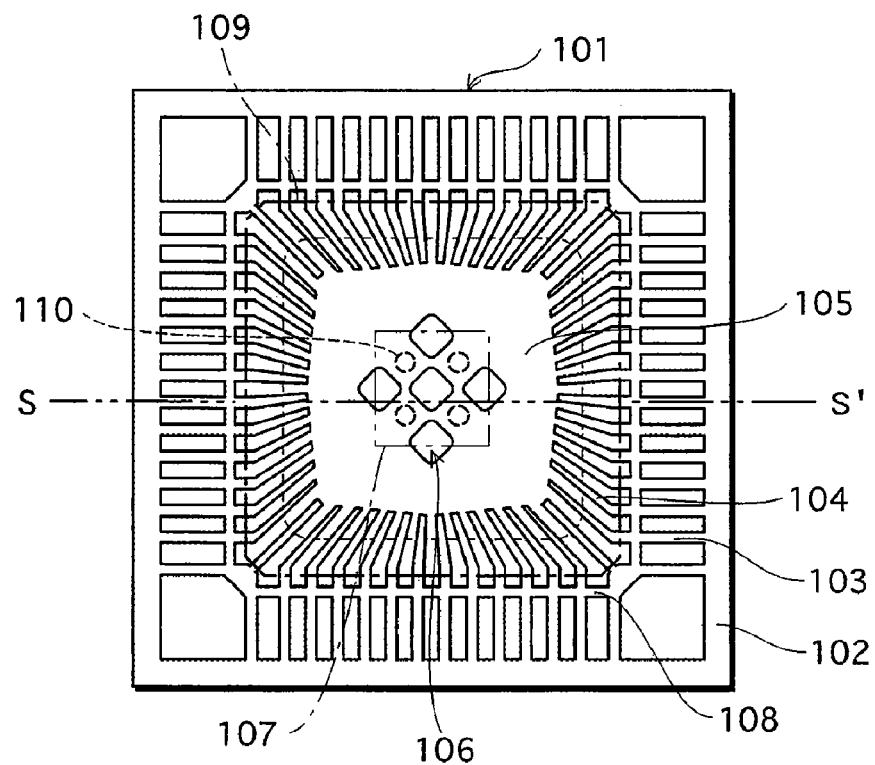
FIG. 1 is a plan view of an embodiment 1 of a leadframe pertaining to the present invention.
Figure 2:
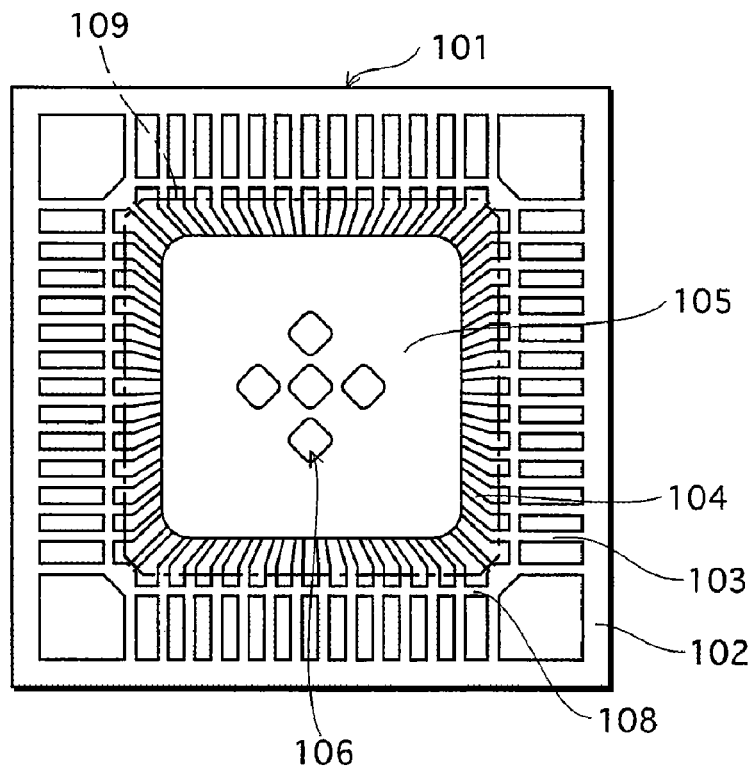
FIG. 2 is a bottom view of FIG. 1.

FIG. 1 is a plan view of an embodiment 1 of a leadframe pertaining to the present invention, while FIG. 2 shows a bottom view of the same.

A leadframe 101 includes a rectangular frame 102, a plurality of outer leads 103 extending at right angles to the four sides of frame 102, a plurality of inner leads 104 that are in series at one end with the outer leads and extend toward the inside of frame 102, and a heat sink 105 adhered to the underside of the opposite ends of inner leads 104. A plurality of substantially square openings 106 with rounded vertices are formed at an approximately 45° angle to the direction in which the outer leads extend. The openings are positioned partially outside a mounting area 107 for the semiconductor element marked by the chain line. The border area between outer leads 103 and inner leads 104 is coupled in the four side directions of frame 102 by a dambar 108. An area 109 marked by the chain line on the inside of dambar 108 indicates the area to be covered by sealing resin in a resin-sealed semiconductor device that uses leadframe 101.

Figure 3:
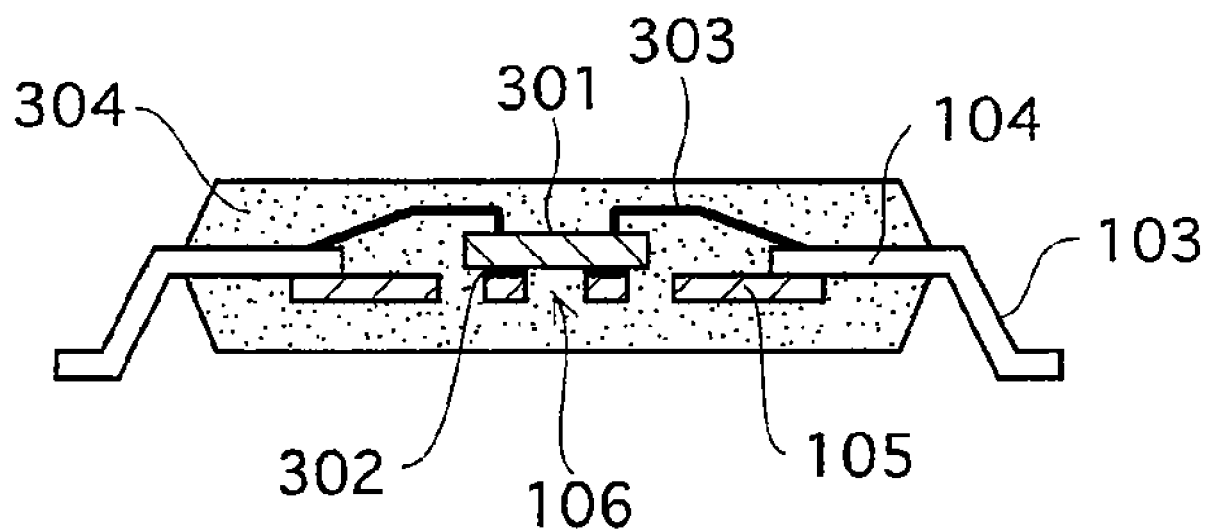
FIG. 3 is a cross-sectional view cutting FIG. 1 at S-S' of a resin-sealed semiconductor device that uses the leadframe of embodiment 1.

The components of leadframe 101 apart from heat sink 105 are obtained by processing sheet metal made from copper alloy having a thickness of 0.15 mm and a hardness of 150 to 185 Hv, for example, using an etching or stamping technique. Heat sink 105 is a copper alloy sheet having a thickness of 0.13 mm, for example. Heat sink 105 is thermally adhered to the underside of the ends of inner leads 104 with adhesive. FIG. 3 is a cross-sectional view cutting FIG. 1 at S-S' of a resin-sealed semiconductor device that uses leadframe 101.

A semiconductor element 301 is adhered to heat sink 105 in mounting area 107 thereof using a die bond 302 such as silver paste, for example. Electrode pads of semiconductor element 301 are connected to corresponding inner leads 104 by wires (e.g. metallic wires). The semiconductor device is resin sealed using a sealing resin 304 made from an epoxy resin, for example, with outer leads 103 left exposed.

The processes for manufacturing a resin-sealed semiconductor device that uses leadframe 101 of the present embodiment are described next with reference to FIGS. 4A to 4F. FIGS. 4A to 4F are cross-sectional views cutting FIG. 1 at S-S'.

Figure 4A:
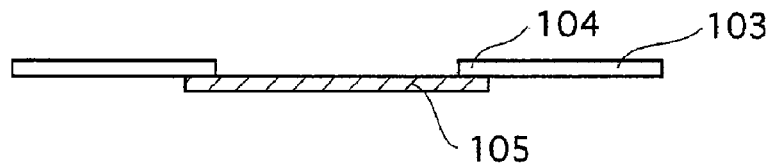
FIGS. 4A-4F are cross-sectional views of processes for manufacturing the resin-sealed semiconductor device of embodiment 1.
Figure 4B:
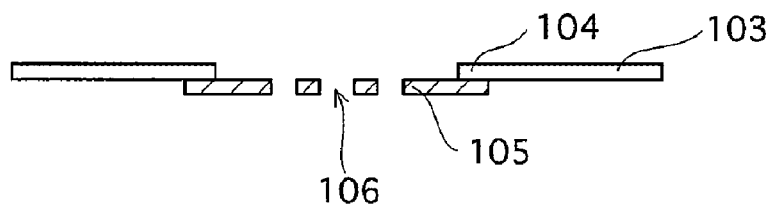

FIGS. 4A and 4B show the manufacturing processes for leadframe 101.

FIG. 4A shows a process of using adhesive to adhere a metallic member (i.e. processed copper alloy sheet metal) that includes outer leads 103 and inner leads 104 etc. coupled together by frame 102 to the upper surface of heat sink 105 via the underside of the ends of inner leads 104. Note that the cross-sectional views omit extraneous items to simplify the diagrams. The same approach is taken below.

FIG. 4B shows a process of forming openings 106 by punch processing heat sink 105 adhered to the metallic member. This completes the manufacture of leadframe 101.

Figure 4C:
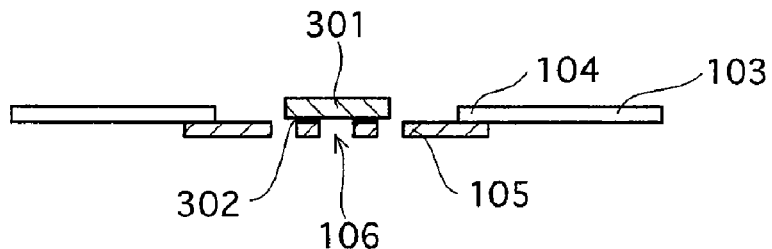

FIG. 4C shows a process of adhering semiconductor element 301 to leadframe 101. Die bond 302 is applied at points 110 on heat sink 105 marked by the dotted lines in FIG. 1, and semiconductor element 301 is placed over these points and adhered thereto.

Figure 4D:
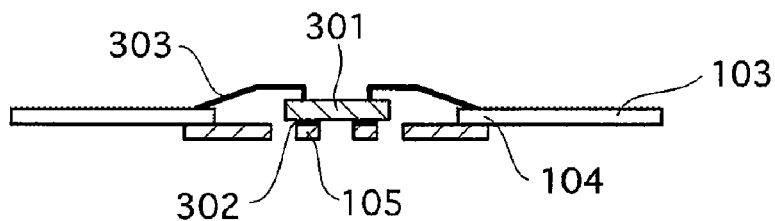

FIG. 4D shows a wire bonding process. The electrode pads of semiconductor element 301 are connected to the tip of corresponding inners lead 104 by wires 303.

Figure 4E:
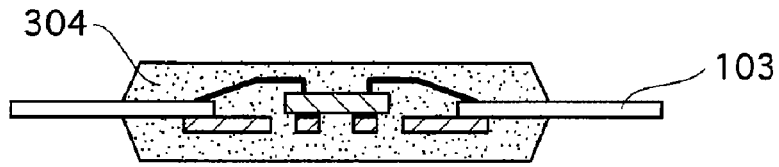

FIG. 4E shows a resin sealing process. A mold is disposed so as to cover leadframe 101 and wires 303 while leaving outer leads 103 exposed, and a sealing resin made from epoxy resin is injected at a mold temperature of 180° C. The injection time is set to 8 seconds, for example. The mold is removed after cooling.

Figure 4F:
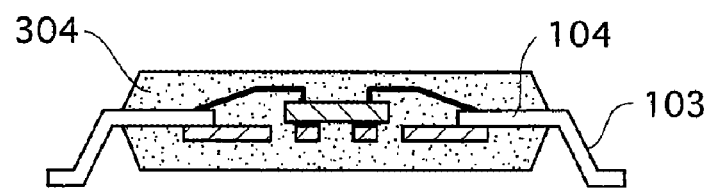

FIG. 4F shows a process of bending outer leads 103. Frame 102 of leadframe 101 is separated using a tie bar cut and outer leads 103 are bent to complete the manufacture of the resin-sealed semiconductor device.

In the present embodiment, sealing resin injected via openings 106 which extend beyond mounting area 107 runs into the space between semiconductor element 301 and heat sink 105, enhancing the adhesion of semiconductor element 301 with heat sink 105. The formation of a gap between semiconductor element 301 and heat sink 105 can thus be prevented.

Embodiment 2

An embodiment 2 of a leadframe with die pads and a resin-sealed semiconductor device that uses the leadframe pertaining to the present invention is described next. The following description relates only to the features of the present embodiment, with description of those parts similar to embodiment 1 having been omitted.

Figure 5:
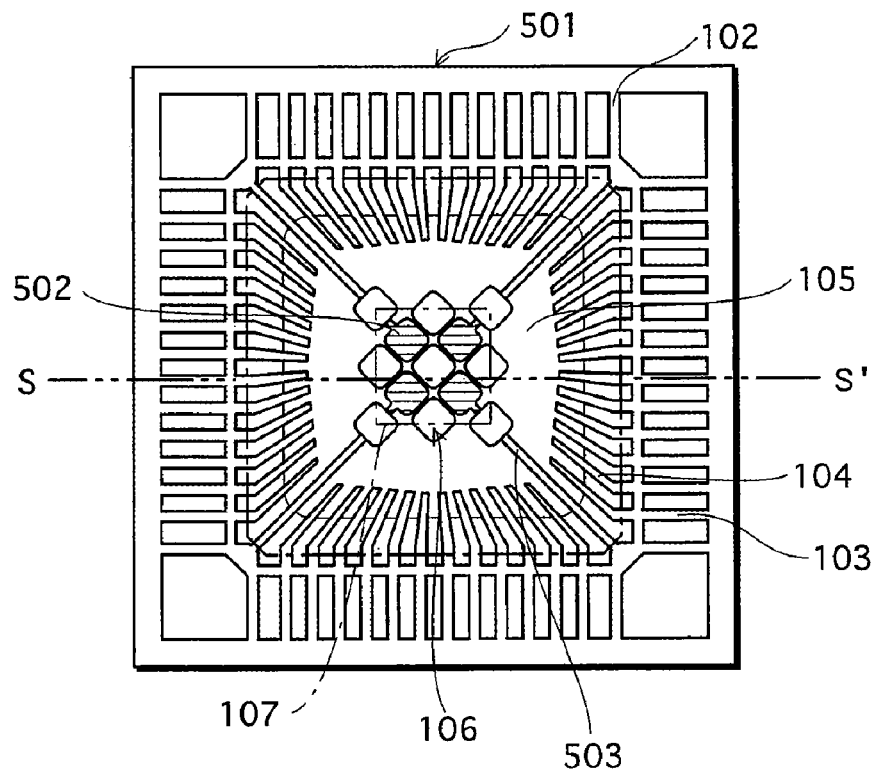
FIG. 5 is a plan view of an embodiment 2 of a leadframe with die pads pertaining to the present invention.
Figure 6:
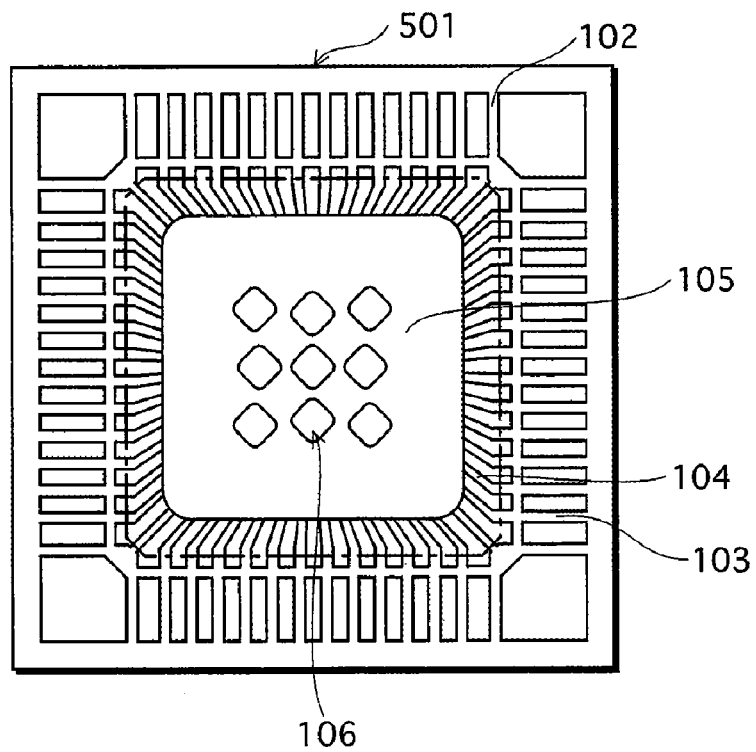
FIG. 6 is a bottom view of FIG. 5.

FIG. 5 is a plan view of a leadframe with die pads, while FIG. 6 is a bottom view of the same. A plurality of die pads 502 is provided in mounting area 107 of a leadframe 501 so as to form an oblique checkered-pattern with openings 106. Die pads 502 are substantially square in shape, and as with openings 106 the sides of the die pads are angled at approximately 45 degrees to the direction in which outer leads 103 extend. Those openings 106 positioned circumferentially lie partially outside mounting area 107.

Since openings 106 and die pads 502 surrounded by openings 106 form a checkered pattern and are angled at approximately 45 degrees to the direction in which outer leads 103 extend, the area of die pads 502 occupying mounting area 107 is ideal for applying the adhesive to adhere semiconductor element 301.

Hanging leads 503 protrude toward a central point from the vertices of dambar 108 of leadframe 501.

Heat sink 105 is adhered to the underside of both die pads 502 and the ends of inner leads 104 using adhesive.

Figure 7:
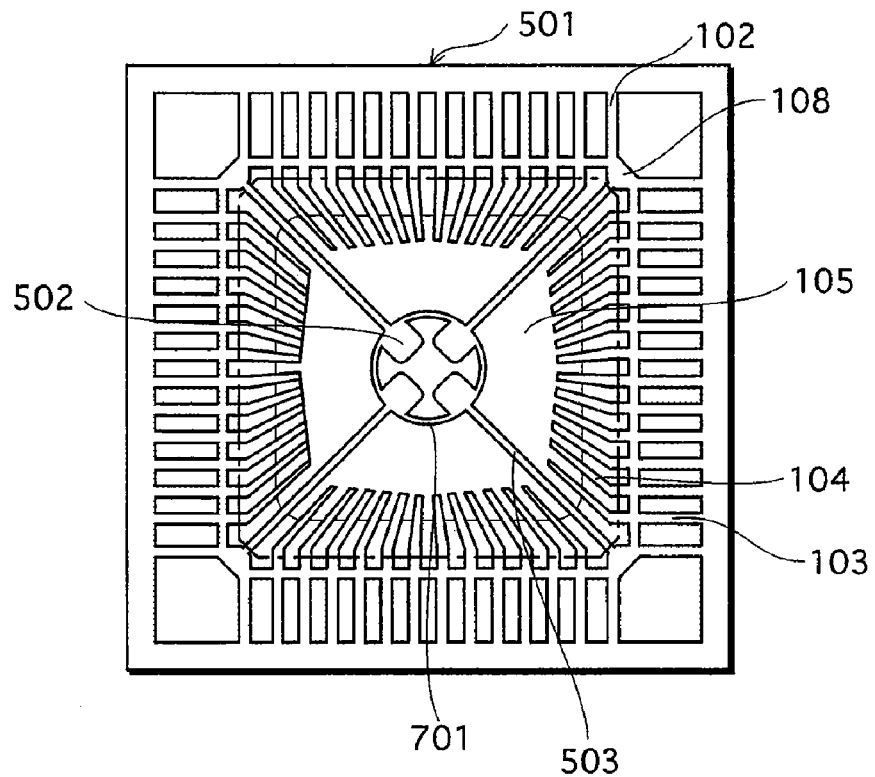
FIG. 7 is a plan view of the leadframe shown in FIG. 5 prior to openings being formed.
Figure 8:
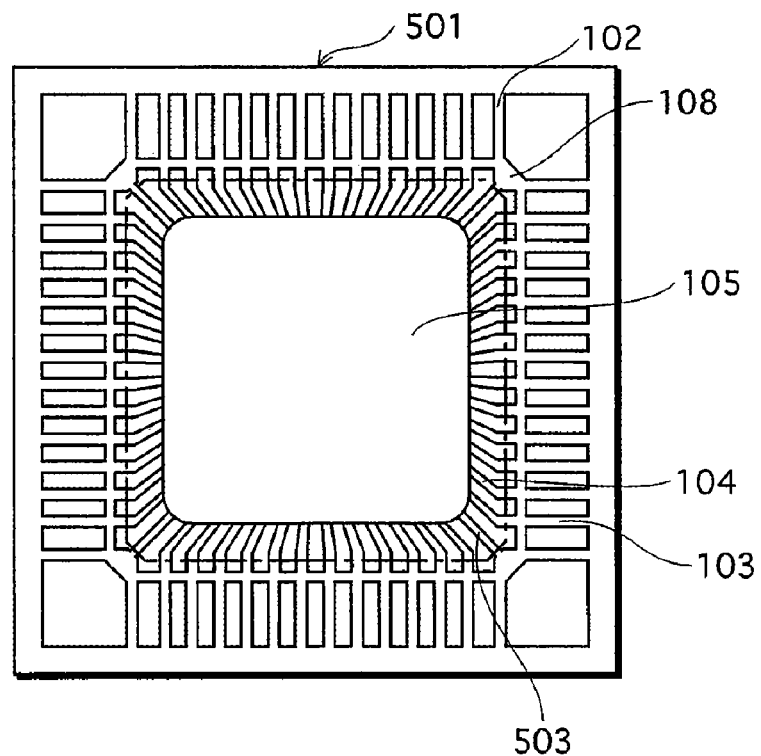
FIG. 8 is a bottom view of FIG. 7.

FIG. 7 is a plan view of the leadframe with die pads shown in FIGS. 5 and 6 prior to openings 106 being formed, while FIG. 8 is a bottom view of the same.

Die pads 502 are coupled together by a coupling ring 701, which is connected to dambar 108 via hanging leads 503. The underside of die pads 502, coupling ring 701 and hanging leads 503 are adhered to the upper surface of heat sink 105 using adhesive.

Note that leadframe 501 excluding heat sink 105 is manufactured, similar to embodiment 1, by one-piece molding copper alloy sheet metal using a stamping technique, for example.

Figure 9:
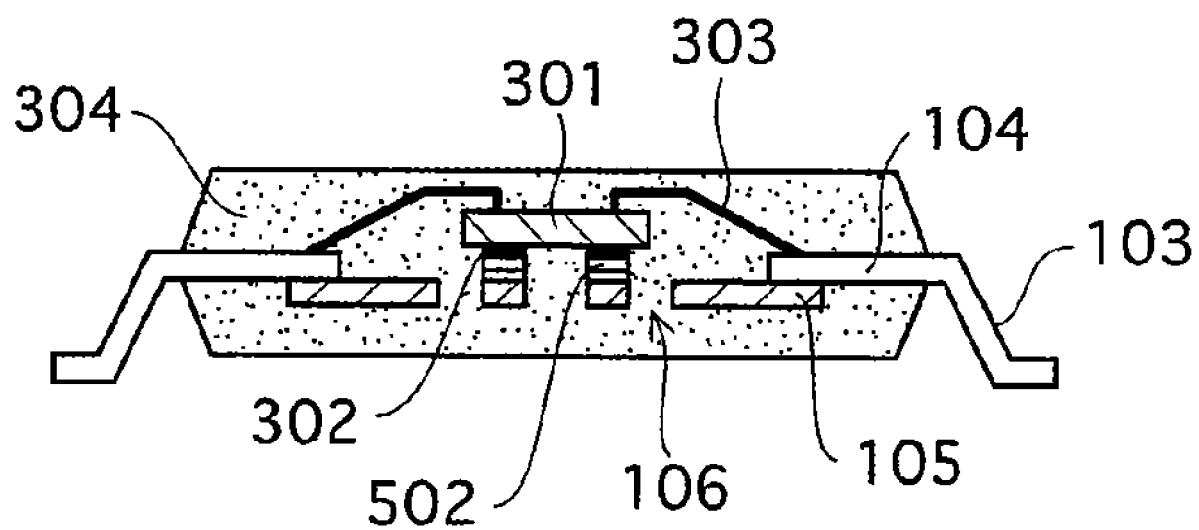
FIG. 9 is a cross-sectional view cutting FIG. 5 at S-S' of a resin-sealed semiconductor device that uses the leadframe with die pads of embodiment 2.

FIG. 9 is a cross-sectional view cutting FIG. 5 at S-S' of a resin-sealed semiconductor device that uses the leadframe with die pads.

With this resin-sealed semiconductor device, die pads 502 are interposed between and adhered with adhesive to both semiconductor element 301 and the upper surface of heat sink 105. The formation of a gap between semiconductor element 301 and heat sink 105 can thus be minimized since this expands the space between semiconductor element 301 and heat sink 105 and facilitates the flow of sealing resin 304 via openings 106.

The processes for manufacturing a resin-sealed semiconductor device that uses leadframe 501 of the present embodiment are described next with reference to FIGS. 10A to 10F.

Note that FIGS. 10A to 10F are cross-sectional views cutting FIG. 5 at S-S', and that extraneous items have been omitted to simplify the diagrams. Note also that description of the processes shown in FIGS. 10D and 10F have been omitted given the substantial similarities with processes shown in FIG. 4 of embodiment 1.

Figure 10A:
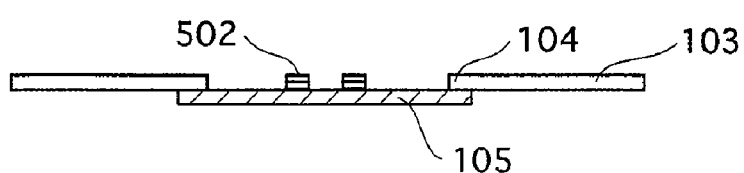
FIGS. 10A-10F are cross-sectional views of processes for manufacturing the resin-sealed semiconductor device of embodiment 2.

FIG. 10A shows a process of using adhesive to adhere a metallic member (i.e. processed copper alloy sheet metal) consisting of outer leads 103, inner leads 104 and die pads 502 etc. coupled together by frame 102 to the upper surface of heat sink 105 via the underside of both die pads 502 and the ends of inner leads 104.

Figure 10B:
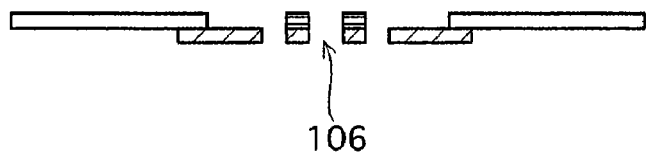

FIG. 10B shows a process of forming openings 106 by punch processing heat sink 105 adhered to the metallic member and at the same time removing coupling ring 701 and part of hanging leads 503 to separate die pads 502. Openings 106, disposed so as to form a checkered pattern with die pads 502, are substantially square in shape and positioned at an approximately 45° angle to the sides of the rectangular form of leadframe 501. Also, those openings 106 positioned circumferentially lie partially outside mounting area 107.

Figure 10C:
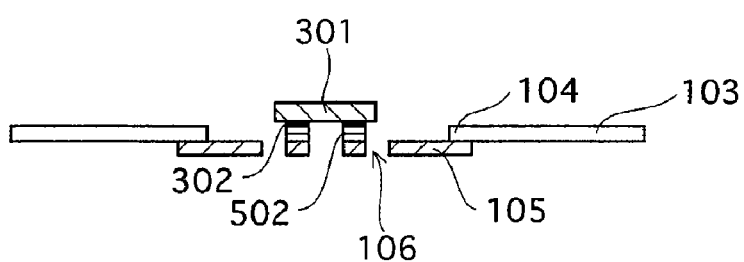

FIG. 10C shows a process of adhering semiconductor element 301 to leadframe 501. Die bond 302 is applied to the upper surface of die pads 502, and semiconductor element 301 is placed over the die pads and adhered thereto.

Figure 10D:
Figure 10E:
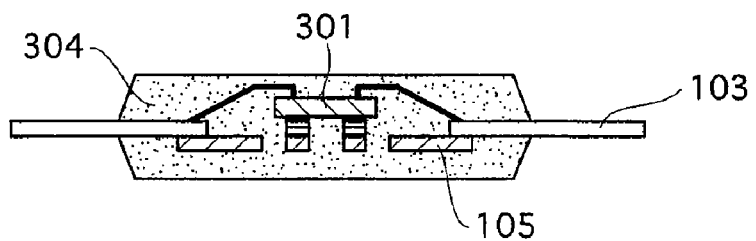
Figure 10F:
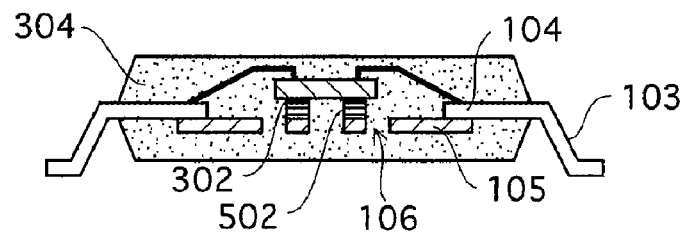

FIG. 10D to 10F are similar to embodiment 1.

Note that the injection of sealing resin shown in FIG. 10E is made easier than in embodiment 1 as a result of the space between semiconductor element 301 and heat sink 105.

Embodiment 3

An embodiment 3 of a leadframe with loop-shaped body and a resin-sealed semiconductor device that uses the leadframe pertaining to the present invention is described next. The following description relates only to the features of the present embodiment, with description of those parts similar to embodiment 1 having been omitted.

Figure 11:
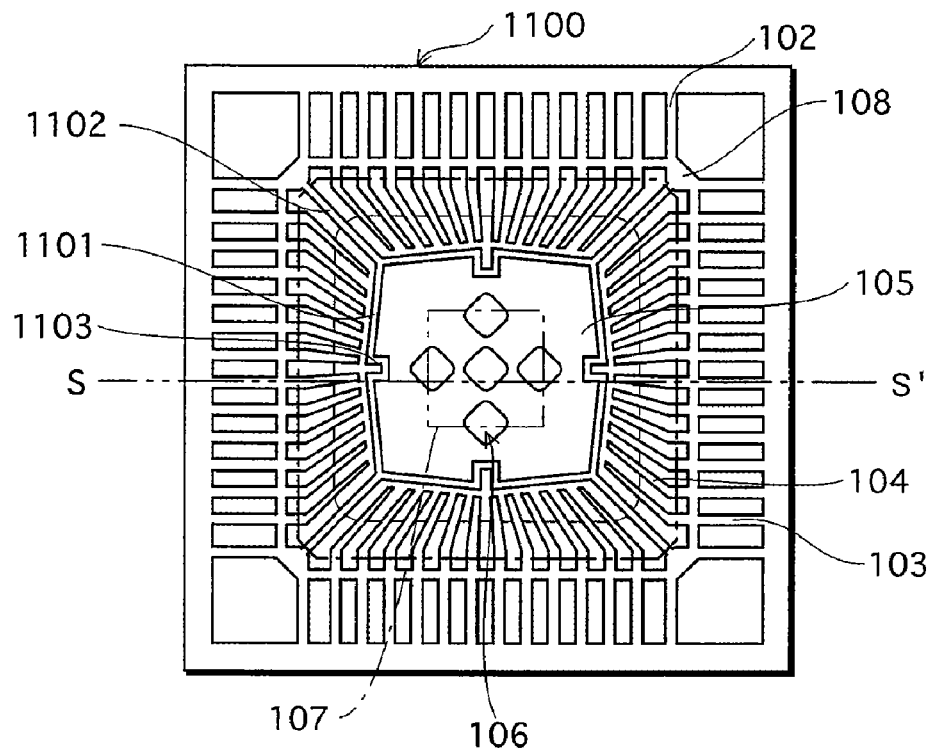
FIG. 11 is a plan view of an embodiment 3 of a leadframe with loop-shaped body pertaining to the present invention.
Figure 12:
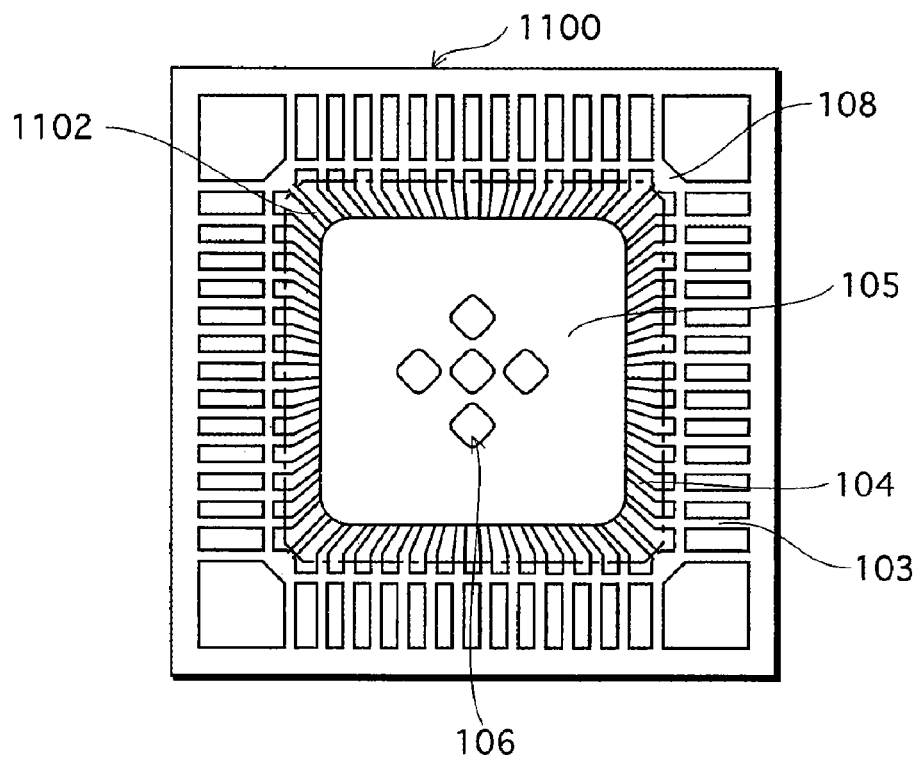
FIG. 12 is a bottom view of FIG. 11.

FIG. 11 is a plan view of a leadframe with loop-shaped body, while FIG. 12 is a bottom view of the same. Leadframe 1100 consists of the addition of a loop-shaped body 1101 that surrounds mounting area 107 for semiconductor element 301 to leadframe 101 of embodiment 1. Cap-shaped protrusions 1103 that protrude toward semiconductor element 301 are formed centrally on sides of loop-shaped body 1101. Hanging leads 1102 that connect loop-shaped body 1101 to dambar 108 are formed at the corners of loop-shaped body 1101. Note that apart from heat sink 105, leadframe 1100 is integrally formed from sheet metal.

Figure 13:
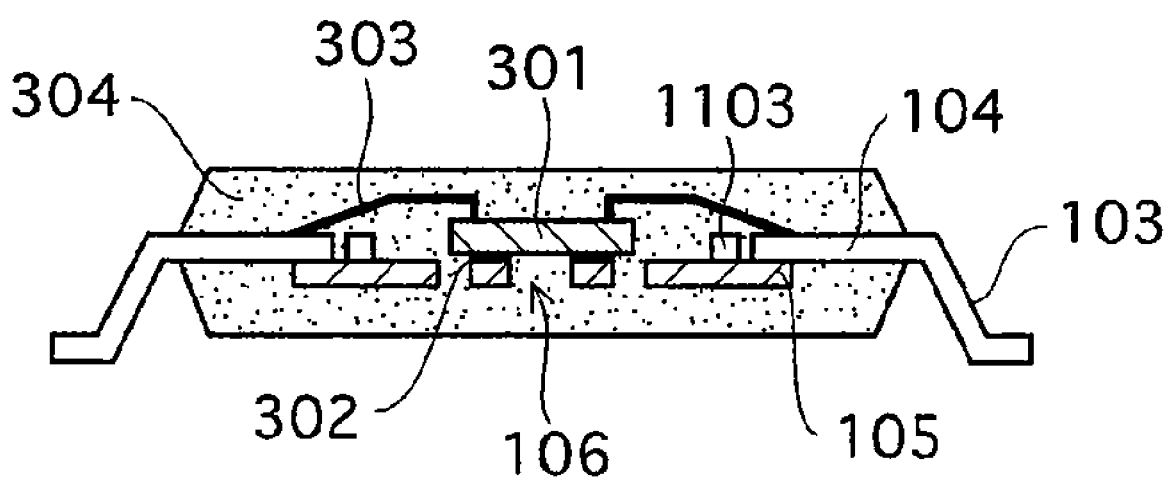
FIG. 13 is a cross-sectional view cutting FIG. 11 at S-S' of a resin-sealed semiconductor device that uses the leadframe with loop-shaped body of embodiment 3.

FIG. 13 is a cross-sectional view of a resin-sealed semiconductor device that uses leadframe 1100. This cross sectional view cuts FIG. 11 at S-S'.

Loop-shaped body 1101 is disposed on the inside of inner leads 104 so as to surround semiconductor element 301. A cross-section of protrusions 1103 is shown in FIG. 13.

FIGS. 14A to 14F are cross-sectional views illustrating processes for manufacturing leadframe 1100 and a resin-sealed semiconductor device that uses leadframe 1100. Note that these cross-sectional views cut FIG. 11 at S-S' with extraneous items having been omitted.

Figure 14A:
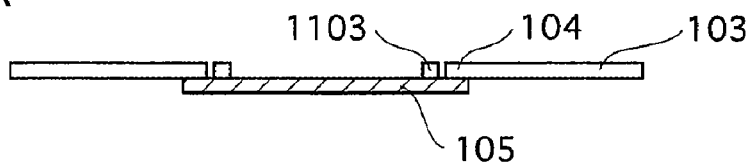
FIGS. 14A-14F are cross-sectional views of processes for manufacturing the resin-sealed semiconductor device of embodiment 3.

FIG. 14A shows a process of adhering heat sink 105 to the metallic member.

Adhesive is applied to the underside of both loop-shaped body 1101 and the ends of inner leads 104, and the upper surface of heat sink 105 is adhered thereto by the adhesive.

The provision of loop-shaped body 1101 connected to hanging leads 1102 on the inside of inner leads 104 in this process prevents the adhesion of heat sink 105 in a warped state, with any heat-related deformation being absorbed by protrusions 1103 provided centrally on the sides of loop-shaped body 1101.

Figure 14B:
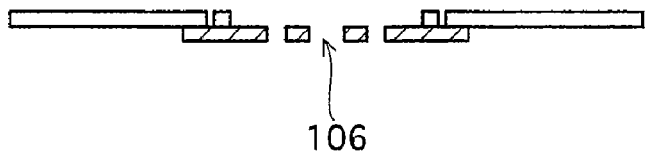
Figure 14C:
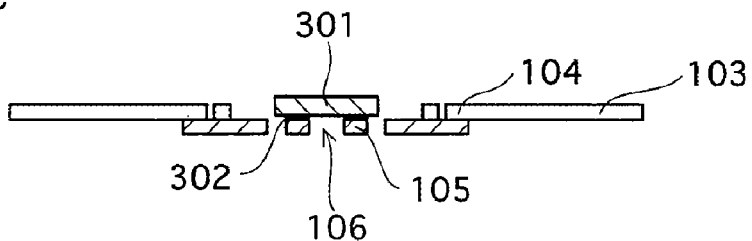
Figure 14D:

Description of the processes in FIGS. 14B to 14D is omitted given the substantial similarities with processes in embodiment 1.

Figure 14E:
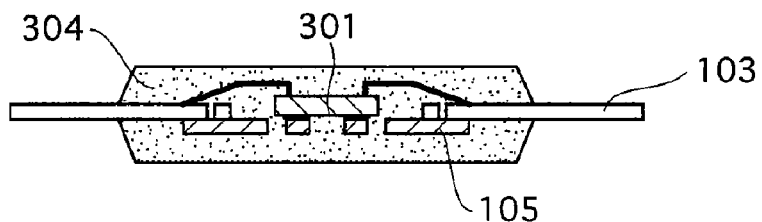

The presence of loop-shaped body 1101 in the resin sealing process in FIG. 14E prevents sealing resin 304 from impacting on semiconductor element 301 when injected.

Figure 14F:
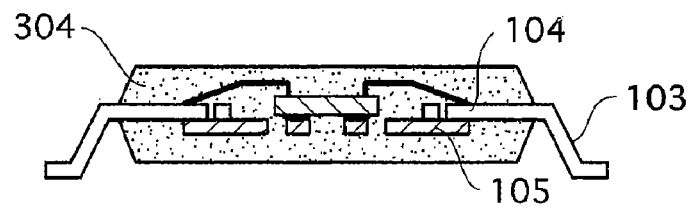

The bending process in FIG. 14F is substantially similar to embodiment 1.

Resin-sealed semiconductor devices that use the leadframes of the preferred embodiments have been described above, although the present invention can naturally be implemented through combining the features of these leadframes.

An exemplary leadframe incorporates the die pads described in embodiment 2 with the loop-shaped body described in embodiment 3.

The flow of the sealing resin in the resin sealing process of embodiments 1 and 2 is described next using FIGS. 15 and 16.

Figure 15:
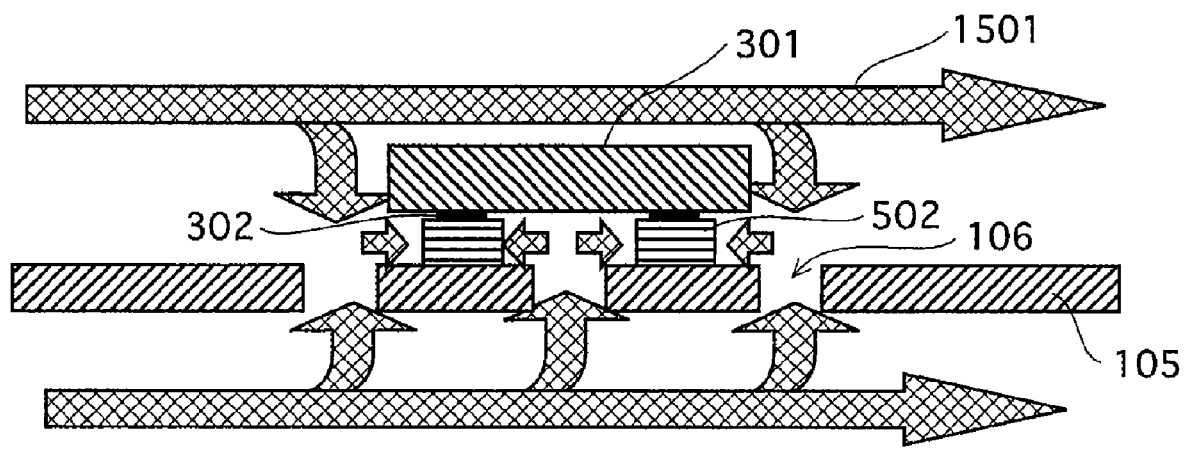
FIG. 15 is a cross-sectional view schematically showing the flow of sealing resin in embodiment 2.
Figure 16:
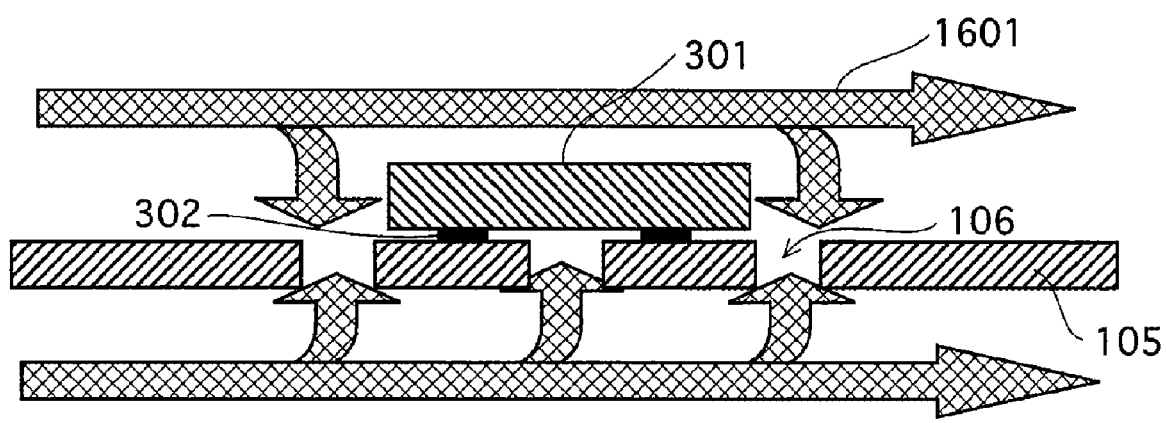
FIG. 16 is a cross-sectional view schematically showing the flow of sealing resin in embodiment 1.

FIG. 15 shows semiconductor element 301 adhered to heat sink 105 via die pads 502, while FIG. 16 shows semiconductor element 301 adhered directly to heat sink 105. Semiconductor element 301 is adhered using die bond 302 in both cases, although when adhered to heat sink 105 via die pads 502 as in embodiment 2, a space equivalent to the thickness of die pads 502 is opened up between semiconductor element 301 and heat sink 105. As shown by arrow A501, this enables the sealing resin to flow sufficiently into the space between semiconductor element 301 and heat sink 105 via openings 106. Even with embodiment 1, the flow of sealing resin between semiconductor element 301 and heat sink 105 via openings 106 is as shown by arrow 1601, preventing the formation of a gap.

COMPARATIVE EXAMPLE

The following illustrates the results of comparative tests that assumed the use of lead-free solder in mounting a resin-sealed semiconductor device ("present device") of the present invention manufactured according to embodiment 2 and a conventional resin-sealed semiconductor device ("conventional device").

Figure 17:
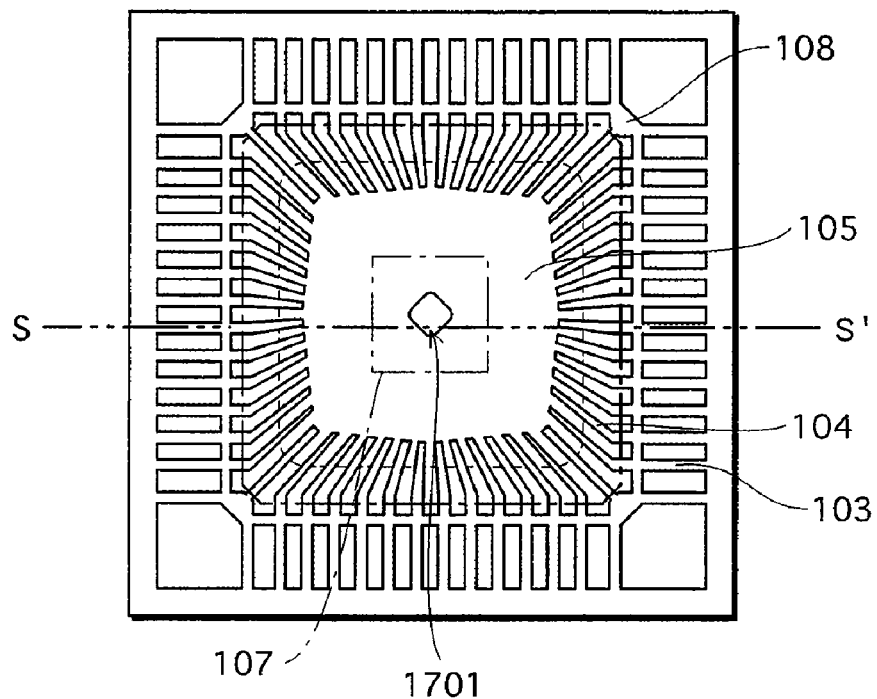
FIG. 17 is a plan view of a conventional leadframe used in a comparative example for verifying the occurrence of cracking etc. in the resin-sealed semiconductor device of embodiment 2.
Figure 18:
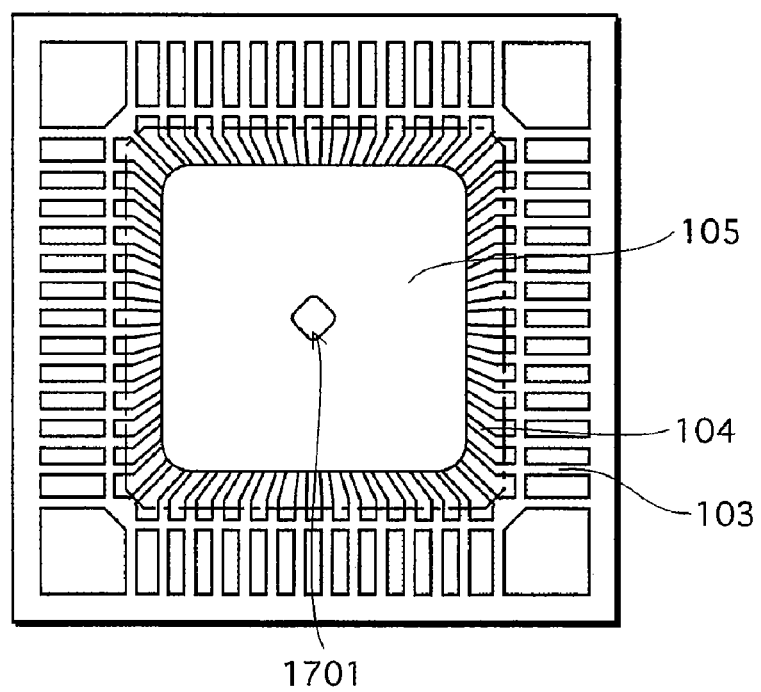
FIG. 18 is a bottom view of FIG. 17.
Figure 19:
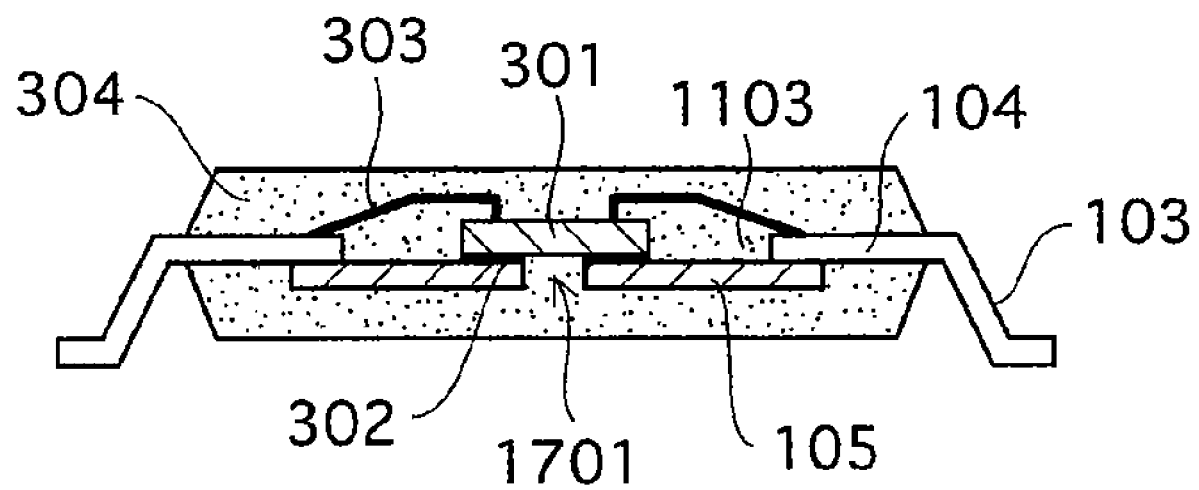
FIG. 19 is a cross-sectional view of a resin-sealed semiconductor device that uses the leadframe shown in FIG. 17.

A plan view of a conventional leadframe is shown in FIG. 17, while a bottom view of the same is shown in FIG. 18. With this leadframe, a single opening 1701 is provided in heat sink 105 below mounting area 107. FIG. 19 is a cross-sectional view cutting FIG. 17 at S-S' of a conventional resin-sealed semiconductor device that uses this leadframe.

The present and conventional devices were firstly baked for 12 hours at 125° C. and dried, before being placed in an atmosphere having a temperature of 30° C. and a relative humidity of 70% for 72 hours to absorb moisture. Then, after having been subjected to a temperature of 265° C. for five minutes, the devices were again placed in an atmosphere having a temperature of 30° C. and a relative humidity of 70% for 96 hours. After again being subjected to a temperature of 265° C. for five minutes, the devices were cooled to room temperature and then supersonic waves were used to investigate for exfoliation and cracking.

15 samples of each device were used.

The number of samples in which exfoliation or cracking occurred is shown in the following table.

|  | Comparative Results | |
|---|---|---|
|  | Exfoliation | Cracking |
| Present Device | 0 | 0 |
| Conventional Device | 15 | 7 |

These results confirm that even when lead-free solder is used to mount the resin-sealed semiconductor device described in embodiment 2 on a substrate, exfoliation of the semiconductor element and cracking of the sealing resin is completely prevented.

Note that while only a single leadframe is illustrated in the preferred embodiments, it is naturally possible to manufacture resin-sealed semiconductor devices by adhering and wire bonding semiconductor elements to a plurality of leadframes formed in series (above/below or to the left/right etc. of one another), and covering the leadframes with a mold and injecting sealing resin, before finally separating the individual semiconductor devices.

Resin-sealed semiconductor devices using leadframes pertaining to the present invention are for use as environmentally friendly semiconductor devices in the field of semiconductor manufacturing.

Although the present invention has been fully described by way of examples with reference to the accompanying drawings, it is to be noted that various changes and modifications will become apparent to those skilled in the art. Therefore, unless such changes and modifications depart from the scope of the present invention, they should be construed as being included therein.

What is claimed is:
1. A semiconductor device comprising:
a lead frame having a plurality of inner leads;
a heat sink isolated from the lead frame, the heat sink being adhered to an underside of one end of each inner lead in an upper surface thereof;
a semiconductor element mounted on the upper surface of the heat sink;
a plurality of metallic wires electrically connecting the inner leads with corresponding electrode pads of the semiconductor element; and
a sealing resin that seals the inner leads, the semiconductor element and the metallic wires, wherein:
the semiconductor element is adhered to the upper surface of the heat sink in a plurality of bonded points by die bond, a plurality of openings are provided in the heat sink, at least one of the plurality of openings being configured to extend to the semiconductor element and being arranged to overlap at least a central portion of the semiconductor element, and when the heat sink is viewed in planar view, one of the bonded points is between at least one pair of the openings.

2. The semiconductor device of claim 1, wherein the openings in the heat sink are disposed to form a checkered pattern with the bonded points.

3. The semiconductor device of claim 1, wherein part of at least one of the openings in the heat sink is located outside a semiconductor mounting area.

4. The semiconductor device of claim 1, wherein when the heat sink is viewed in planar view, the heat sink and the one end of each inner lead overlap.

5. The semiconductor device of claim 1, wherein the at least one of the plurality of openings includes the sealing resin therein.

6. A semiconductor device, comprising:

a lead frame having a plurality of inner leads;

a heat sink isolated from the lead frame, the heat sink being adhered to an underside of one end of each inner lead in an upper surface thereof and having a plurality of openings formed therein;

a semiconductor element, at least one of the plurality of openings being configured to extend to the semiconductor element and being arranged to overlap at least a central portion of the semiconductor element, said semiconductor element being adhered to the upper surface of the heat sink via a die pad, the die pad being arranged such that, when the heat sink is viewed in planar view, the die pad is between a pair of the openings;

a plurality of metallic wires electrically connecting the inner leads with corresponding electrode pads of the semiconductor element; and a sealing resin that seals the inner leads, the semiconductor element and the metallic wires.

7. The semiconductor device of claim 6, wherein part of at least one of the openings in the heat sink is located outside a semiconductor mounting area.

8. The semiconductor device of claim 6, wherein the semiconductor element and the upper surface of the heat sink are adhered to each other via a plurality of the die pads.

9. The semiconductor device of claim 8, wherein the openings in the heat sink are disposed to form a checkered pattern with the die pads.

10. The semiconductor device of claim 6, further comprising:

a loop-shaped body that is encircled by a virtual line connecting the one end of each of the inner leads, and that surrounds a semiconductor mounting area, wherein, formed extending inward on an inner edge of each side of the loop-shaped body in a central part of the side is a protrusion with a concave part formed on an outer edge of the side in a portion corresponding to the protrusion, and the upper surface of the heat sink and an underside of the loop-shaped body are adhered to each other.

11. The semiconductor device of claim 6, wherein when the heat sink is viewed in planar view, the heat sink and the one end of each inner lead overlap.

12. The semiconductor device of claim 6, wherein the at least one of the plurality of openings includes the sealing resin therein.

13. A lead frame comprising:

a plurality of outer leads;

a plurality of inner leads coupled with the outer leads; and a heat sink isolated from the lead frame, the heat sink being adhered to an underside of one end of each inner lead in an upper surface thereof, and having a plurality of openings formed at a semiconductor mounting area therein, at least one of the plurality of openings being configured to extend to a semiconductor element and being arranged to overlap at least a central portion of the semiconductor element.

14. The lead frame of claim 13, wherein part of at least one of the openings in the heat sink is located outside the semiconductor mounting area.

15. The lead frame of claim 13, further comprising:

a die pad attached to the upper surface of the heat sink, in the semiconductor mounting area on the upper surface of the heat sink, wherein the openings are arranged such that, when the heat sink is viewed in planar view, the die pad is between a pair of the openings.

16. The lead frame of claim 15, wherein a plurality of the die pads are disposed on the upper surface of the heat sink.

17. The lead frame of claim 16, wherein the openings in the heat sink are disposed to form a checkered pattern with the die pads.

18. The lead frame of claim 13, further comprising:

a loop-shaped body that is encircled by a virtual line connecting the one end of each of the inner leads, and that surrounds the semiconductor mounting area, wherein, formed extending inward on an inner edge of each side of the loop-shaped body in a central part of the side is a protrusion with a concave part formed on an outer edge of the side in a portion corresponding to the protrusion, and the upper surface of the heat sink and an underside of the loop-shaped body are adhered to each other.

19. The lead frame of claim 13, wherein when the heat sink is viewed in planar view, the heat sink and the one end of each inner lead overlap.

20. The lead frame of claim 13, wherein the at least one of the plurality of openings includes a sealing resin therein.

* * * * *